US006919835B2

(12) United States Patent

Welles, II et al.

(10) Patent No.: US 6,919,835 B2
(45) Date of Patent: Jul. 19, 2005

(54) INFINITE ELECTRONIC INTEGRATOR

(75) Inventors: Kenneth Brakeley Welles, II, Scotia, NY (US); Daniel David Harrison, Delanson, NY (US); Ralph Thomas Hoctor, Saratoga Springs, NY (US)

(73) Assignee: General Electric Company, Niskayuna, NY (US)

(*) Notice: Subject to any disclaimer, the term of this patent is extended or adjusted under 35 U.S.C. 154(b) by 159 days.

(21) Appl. No.: 10/248,069

(22) Filed: Dec. 16, 2002

(65) Prior Publication Data

US 2004/0113678 A1 Jun. 17, 2004

(51) Int. Cl.[7] ..................................... H03M 1/15

(52) U.S. Cl. ..................... 341/155; 341/118; 341/120; 327/336

(58) Field of Search ............................ 341/118, 120, 341/143, 158–159, 166–170; 327/336

(56) References Cited

U.S. PATENT DOCUMENTS 3,893,103 A * 7/1975 Prill ........................ 341/118
4,617,550 A * 10/1986 Glincman .................. 341/167
4,694,277 A * 9/1987 Takahashi .................. 341/118
4,849,757 A * 7/1989 Krenik ...................... 341/167
5,101,206 A * 3/1992 Riedel ...................... 341/156
5,117,227 A * 5/1992 Goeke ...................... 341/166
5,770,956 A * 6/1998 Rolff ......................... 327/103
6,243,034 B1 * 6/2001 Regier ...................... 341/166
6,693,577 B2 * 2/2004 Yamamoto ................. 341/155

* cited by examiner

*Primary Examiner*—Michael Tokar
*Assistant Examiner*—Khai M. Nguyen
(74) *Attorney, Agent, or Firm*—Jean K. Testa; Patrick K. Patnode

(57) ABSTRACT

An electronic integrator includes a compensation circuit which maintains an output of the integrator within a desired range. The compensation circuit includes a comparator which continuously compares the integrator output to a reference value, and a correction circuit which inputs a correction signal into the integrator when the reference value has been met or exceeded. The correction signal is preferably a fixed charge which lowers the voltage in an integrating capacitor by a predetermined amount, thereby ensuring that subsequent output of the integrator is less than the reference value. Through this compensation circuit, the integrator continuously operates without interruption, including without ever having to be reset. Further, the integrator is able to integrate both positive and negative input signals regardless of their magnitude. The integrator may also be used to regulate input signals into an analog-to-digital converter to ensure that those signals never exceed the operational limits of the converter.

17 Claims, 5 Drawing Sheets

INFINITE ELECTRONIC INTEGRATOR

BACKGROUND OF INVENTION

This invention generally relates to integrating analog signals, and more particularly to a circuit for regulating the output of an electronic integrator. The invention also relates to an analog-to-digital converter having an overflow compensation circuit which regulates the output of an electronic integrator connected to the analog-to-digital converter.

Integrators have proven useful in many applications which require the generation or processing of analog signals. These applications include computed-tomography (CT) machines, nuclear systems, analog-to-digital converters, and various types of sensors. An integrator is conventionally formed from a capacitor connected between the inverting terminal and the output terminal of an operational amplifier. In operation, a current/voltage signal is input into the inverting terminal and the operational amplifier outputs a signal which corresponds to the integral of the input.

In circuits of this type, a linear relationship exists between the input charge and the output voltage as long as the operational amplifier is in its active region. This relationship may be represented by the equation $Q_{in}=C_{int}V_{out}$, where $Q_{in}$ is the input charge, $C_{int}$ is the integrating capacitor, and $V_{out}$ is the output voltage. From this equation, it is clear that the integrating capacitor can store only a finite amount of charge before the operational amplifier becomes saturated. For maximum gain, $C_{int}$ is designed to be as small as possible. Therefore, in order to accommodate a large dynamic range of input charge, conventional integrators typically use banks of integrating capacitors, which may either be pre selected or dynamically selected to preserve the linear relationship between the input charge and the output voltage.

Medical systems and other applications integrate data signals over certain periods of time. It has been determined that interruptions during these periods, even minor ones, degrade the accuracy of the integrator output, and this, in turn, translates into inaccuracies in the overall system.

One interruption that routinely occurs derives from the use of conventional integrators. In these integrators, the expected value of the integrated signal is intended to average zero. Certain circumstances, however, inevitably arise which cause the integrator to output signals which reach unacceptable positive or negative levels. In order to correct this problem, conventional integrators must be periodically reset to zero or some other reference value.

In view of the foregoing considerations, it would be highly desirable to provide an integrator which does not have to be reset to zero during its operation, and more specifically to provide one which is able to continuously integrate input data signals without interruption. It would also be desirable to provide such an integrator which can integrate both positive and negative input signals regardless of the magnitude of these signals, within reasonable limits.

SUMMARY OF INVENTION

An electronic integrator is provided which operates continuously and without ever having to be reset to zero or some reference value. The electronic integrator can further integrate both positive and negative input signals regardless of their magnitude. According to one aspect of the invention, these benefits are achieved through the use of a compensation circuit which continuously monitors the integrator input and then adjusts the integrator to maintain its output to within a predetermined operational range. An analog-to-digital converter circuit may, for example, use this integrator as an overflow compensation circuit, which prevents the converter from accepting input signals that would cause damage or malfunction.

In accordance with a preferred embodiment, the integrator comprises a compensation circuit having: (a) a comparator which continuously compares an output of the integrator to a reference value, and (b) a correction circuit which inputs a correction signal into the integrator if the comparator determines that the output of the integrator equals or exceeds the reference value. The correction signal is preferably in the form of a fixed charge which lowers the charge stored in the integrating capacitor of the integrator by a predetermined amount, thereby reducing the subsequent output of the integrator to less than the reference value.

The compensation circuit may advantageously be constructed to monitor both positive and negative input signals into the integrator. This is accomplished by providing a negative compensation circuit and a positive compensation circuit. The negative compensation circuit has a comparator which compares an output of the integrator to a positive reference value. If the comparator determines that the reference value has been met or exceeded, a correction circuit outputs a negative correction signal to the integrating capacitor of the integrator to reduce the charge stored therein. The positive compensation circuit is similarly constructed, except that its comparator compares the integrator output to a negative reference value and then outputs a positive correction signal when this reference value has been met or exceeded. Through these compensation circuits, an integrator according to preferred embodiments of the present invention is able to continuously integrate signals without interruption regardless of the size of the input signals.

Preferred embodiments of the present invention further comprise an analog-to-digital converter circuit which uses an integrator as described above to prevent an overflow condition from occurring. In this converter, the positive and negative compensation circuits compare the integrator output to upper and lower operational limits of an A/D converter. When these limits are exceeded, a correction signal is output to correct the integrator output back to an acceptable operational range of the A/D converter. In order to ensure that the converter always operates within this range, the A/D converter operates in accordance with one phase of a clock and the compensation circuit operates in accordance with a non-overlapping second phase of the clock which occurs before the first phase.

The converter circuit is also equipped with a range extend bits latch which stores digital information indicative of whether the compensation circuit provided a correction signal to the integrator. This information is then fed to data gathering circuitry which corrects the accuracy of the A/D converter output to reflect this correction. In order to ensure proper operation, positive and negative current sources used to generate the correction signals of the compensation circuit are calibrated.

DETAILED DESCRIPTION

The present invention comprises, in one respect, an electronic integrator equipped with a compensation circuit for controlling an output of the integrator. The present invention further comprises an analog-to-digital converter circuit which adjustably converts the output of an electronic integrator to meet predetermined criteria. The present invention still further comprises methods for controlling the operation of the electronic integrator and analog-to-digital circuits mentioned above. All three aspects described hereinabove are suitable for use in a transmitted reference delay hopped transmitter found in medical-equipment communications systems, for example. Those skilled in the art will appreciate, however, that the principles of the present invention may be incorporated into other systems or put to other uses, including but not limited to radio, sonar and radar receivers, or any other system or device where the integrated output of a correlator must be continuously monitored.

Figure 1:
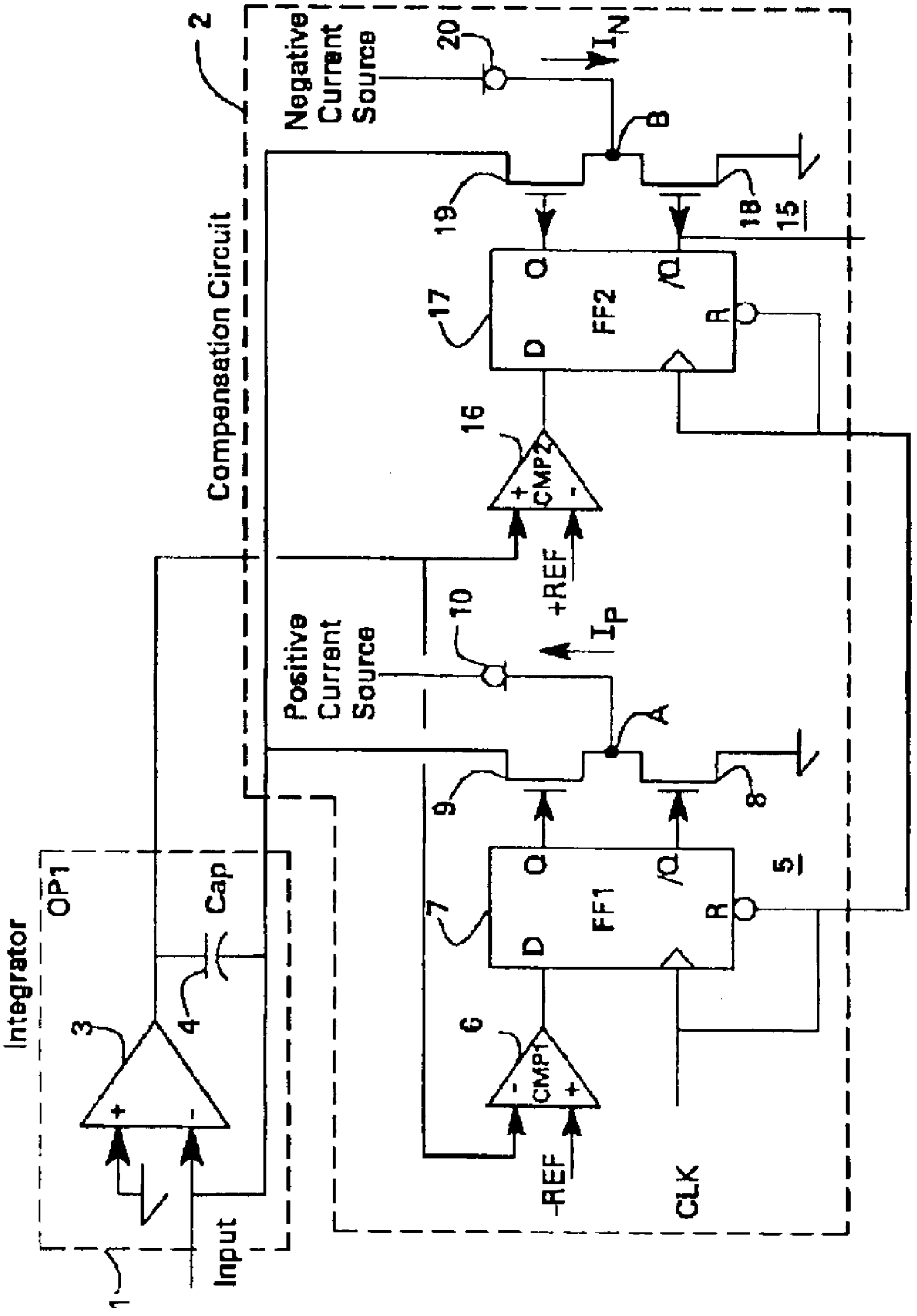
FIG. 1 is a block and schematic diagram showing an integrator in accordance with a preferred embodiment of the present invention.

Referring to FIG. 1, a preferred embodiment of an electronic integrator of the present invention includes an integrator 1 connected to a compensation circuit 2. The integrator preferably includes an operational amplifier 3 and an integrating capacitor 4. As shown, the operational amplifier has its inverting terminal connected to receive an input analog signal and its non-inverting terminal connected to ground or a reference potential. The capacitor is connected in parallel with the operational amplifier, and more specifically to its output and non-inverting terminals. The integrator shown in FIG. 1 is merely illustrative of the present invention. Those skilled in the art can appreciate that other integrator circuit configurations may also be used in accordance with preferred embodiments of the present invention.

The compensation circuit adjusts the output of the integrator so that it is always within a predetermined range. To perform this adjusting function, the compensation circuit preferably includes a positive compensation circuit 5 and a negative compensation circuit 15. The positive compensation circuit has a comparator 6, a logic circuit 7, switches 8 and 9, and a positive current source 10. Functionally, the comparator compares an output of the integrator with a negative reference value. The logic circuit latches the output of the comparator in accordance with a clock signal CLK. In FIG. 1, the logic circuit is shown as a D-type flip flop. However, those skilled in the art can appreciate that other logic circuits may alternatively be used.

The switches of the positive compensation circuit are connected to the Q and Q complement outputs of the D flip flop, respectively. In one embodiment, these switches are MOSFET transistors but another type of switch may be used if desired. Transistors 8 and 9 are switched on and off based on the outputs of the flip flop, and in accordance with the input clock signal. Connected to a node A between transistors 8 and 9 is the positive current source 10. Because the flip flop outputs are complementary, only one transistor is on at any given time. This serves to control the timing of connecting the positive current source to the integrator.

The negative compensation circuit 15 may be constructed as the mirror image of the positive compensation circuit 5. As shown, the negative compensation circuit includes a comparator 16, a logic circuit 17, switches 18 and 19, and a negative current source 20. Functionally, the comparator compares an output of the integrator with a positive reference value. Preferably, the logic circuit latches the output of the comparator in accordance with the same clock signal CLK which is used to control the logic circuit in the positive compensation circuit. Logic circuit 17 is illustratively shown as a D flip flop, but those skilled in the art can appreciate that another type of logic circuit may alternatively be used.

The switches of the negative compensation circuit are connected to the Q and Q complement outputs of D flip flop 17, respectively. Preferably, these switches are MOSFET transistors but another type of switch may be used if desired. Transistors 18 and 19 are switched on and off based on the outputs of the flip flop, in accordance with the input clock signal. Connected to a node B between transistors 18 and 19 is the negative current source 20. Because the flip flop outputs are complementary, only one transistor is on at any given time. This serves to control the timing of connecting the negative current source to the integrator.

The compensation circuits in accordance with preferred embodiments of the present invention function by outputting a correction signal to the integrator when their respective positive and negative reference values are met or exceeded. The correction signal corresponds to the output of either the positive current source or the negative current source. This output causes the voltage output of the integrator to be corrected back a predetermined amount corresponding to the respective magnitudes of the current sources and based on the amount of time the current sources are connected to the integrator.

Because the comparator circuits in the positive and negative compensation circuits compare the output of the integrator to different reference values, the integrator will not be connected to the positive current source and negative current source at the same time. More specifically, when the output of the integrator is less than or equal to the negative reference value, the positive compensation circuit outputs a correction signal from the positive current source to the integrator. The negative current source is disconnected from the integrator under these conditions. Conversely, when the output of the integrator is greater than or equal to the positive reference value, the negative compensation circuit outputs a correction signal from the negative current source to the integrator. The positive current source is disconnected from the integrator under these conditions.

The reference values used in the compensation circuits may be selected to achieve virtually any desired limit on the output of the integrator. Preferably, as shown, the reference values are set so that the output of the integrator does not exceed positive and negative operational limits of a circuit to which the integrator is connected. The reference values, however, may be set to other values. For example, if desired, the compensation circuits may both be positive compensation circuits, i.e., ones which compare the integrator output to respective minimum and maximum positive voltage values. Alternatively, the compensation circuits may compare the integrator output to both minimum and maximum negative voltage values. In accordance with another embodiment, only one compensation circuit may be used. In this case, the integrator output would be compared to only one reference value, selected to achieve a desired purpose. In accordance with still another embodiment, three or more compensation circuits may be used, each with a different reference value to thereby limit the output of the integrator.

Figure 2:
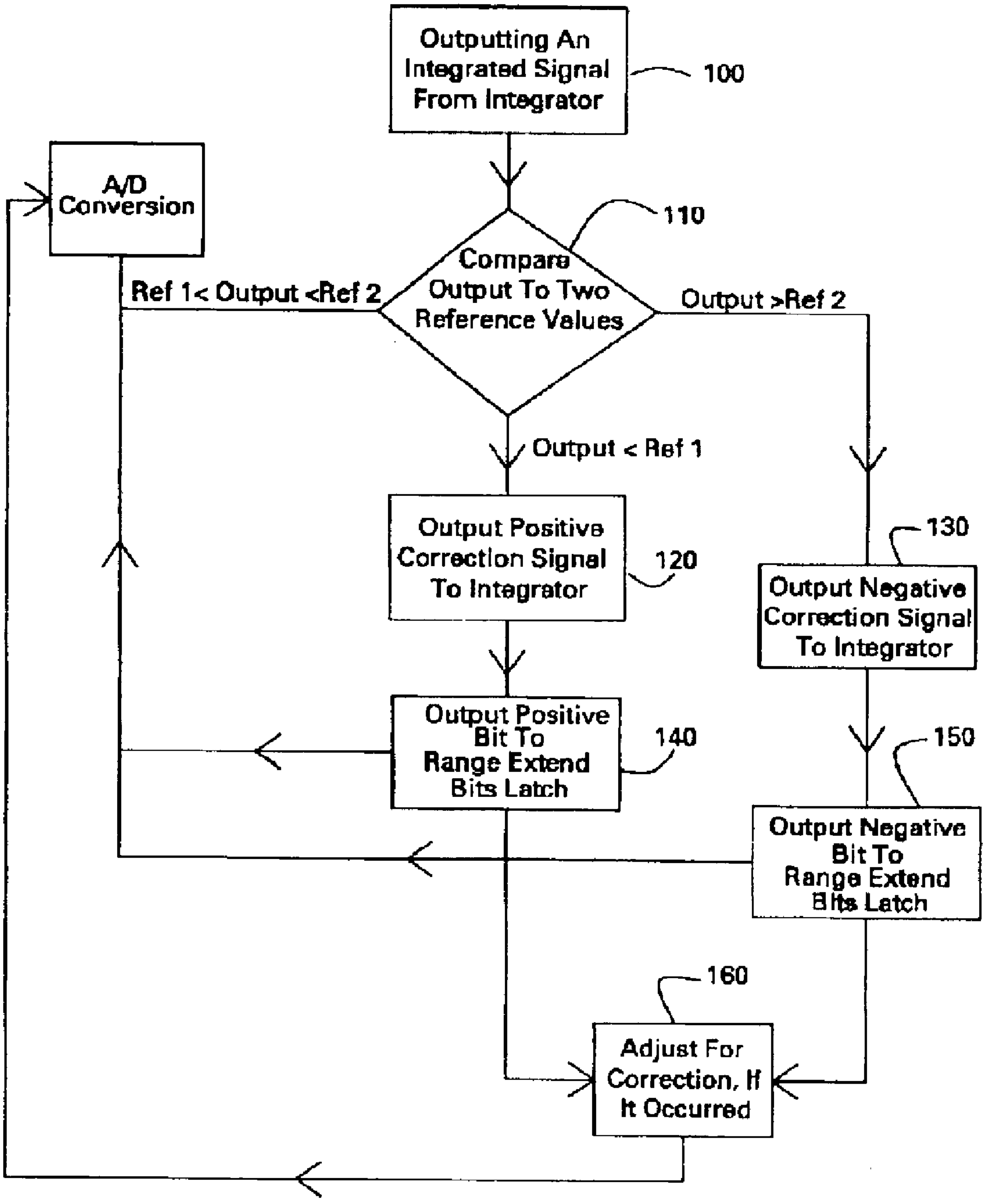
FIG. 2 is a flow diagram showing steps included in a method for regulating the output of an integrator in accordance with a preferred embodiment of the present invention, which method may then be incorporated within a method for controlling an analog-to-digital converter circuit.

Referring to FIGS. 1 and 2, in operation, the integrator outputs an analog signal proportional to the integral of the signal into its input terminal. (Block 100). This output is compared to the reference values in the positive and negative compensation circuits, in accordance with clock signal CLK. (Block 110). If the output lies between these reference values, then neither compensation circuit outputs a correction signal to the integrator. In both circuits, the correction signal is blocked as a result of transistors 9 and 19 being switched off and transistors 8 and 18 being switched on, thereby connecting the current sources to ground. Under these circumstances, the integrator will continue to integrate the analog input signal.

When the voltage from the integrator is negative, comparator 6 detects when this voltage (i.e., the voltage stored in capacitor 4) meets or drops below the negative reference value in the positive compensation circuit. When this occurs, the next rising edge of CLK causes D flip flop 7 to latch the output of comparator 6 to its Q terminal, which causes transistor 9 to turn on. Simultaneously, the Q complement output switches transistor 8 off. As a result, the positive current source is connected to the capacitor 4 of the integrator for a predetermined period of time as determined by the length of time the clock signal CLK is high, thereby increasing the capacitor voltage therein by an amount proportional to the magnitude of the positive current source. (Block 120): As a result, the output of the integrator is corrected once again above the negative reference value, so that integration may continue from this adjusted level.

When the voltage from the integrator is positive, comparator 16 detects when this voltage (i.e., the voltage stored in capacitor 4) meets or exceeds the positive reference value in the negative compensation circuit. When this occurs, the next rising edge of clock signal CLK causes D flip flop 17 to latch the output of comparator 16 to its Q terminal, which causes transistor 19 to turn on. Simultaneously, the Q complement output switches transistor 18 off. As a result, the negative current source is connected to the capacitor 4 of the integrator for a predetermined period of time as determined by the length of time the clock signal CLK is high, thereby reducing the capacitor voltage therein by an amount proportional to the magnitude of the negative current source. (Block 130). As a result, the output of the integrator is corrected once again below the positive reference value, so that integration may continue from this adjusted level.

Because the compensation circuits continuously limit the output of the integrator to within a desired range, the invention may be referred to as an "infinite" integrator. This represents a substantial improvement in the art because, unlike conventional integrator circuits, an integrator according to preferred embodiments of the present invention never has to be reset to zero its output never becomes unacceptably high or low. These advantages make the infinite integrator suitable for use in a variety of systems such as integration of correlated signals which are either sensitive to or intolerant of interruptions cause by a reset operation. Also, because no reset is required, an integrator according to preferred embodiments of the present invention may increase the speed and accuracy of these systems, where conventional integrators would produce the opposite effect.

Figure 3:
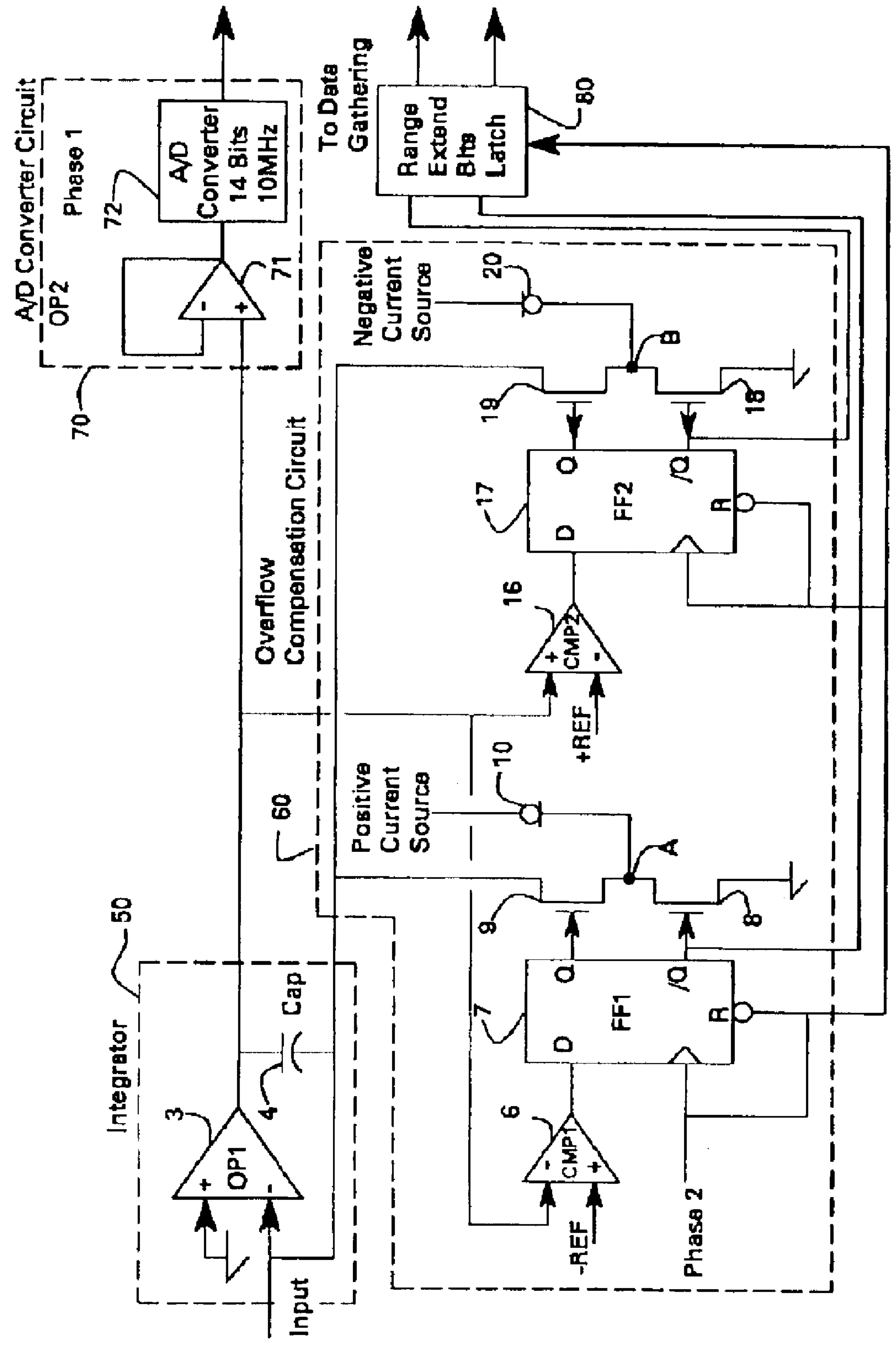
FIG. 3 is a block and schematic diagram showing an analog-to-digital converter in accordance with a preferred embodiment of the present invention.

Referring to FIG. 3, a preferred embodiment of the analog-to-digital converter circuit of the present invention includes an integrator 50, an overflow compensation circuit 60, an analog-to-digital converter 70, and a range extend bits latch 80. The integrator and overflow compensation circuit may be constructed in a manner similar to the compensation circuit shown in FIG. 1, except that in this embodiment the overflow compensation circuit is configured to limit the output of the integrator to lie within the operational limits of the analog-to-digital converter, i.e., to prevent the integrator from applying voltage to the analog-to-digital converter which would cause inaccurate measurements.

Preferably, the overflow compensation circuit includes positive and negative compensation circuits as previously discussed. Consequently, where applicable, FIGS. 1 and 3 use like reference numerals. In the positive compensation circuit, the negative reference value may correspond to a fixed fraction, which, for example, may be 0.75 of the maximum negative voltage the analog-to-digital converter is able to handle without becoming damaged or malfunctioning. Analogously, in the negative compensation circuit, the positive reference value may correspond to a fixed fraction, which again may be 0.75 of the maximum positive voltage the analog-to-digital converter is able to handle. The positive and negative reference values may be selected to be other values, for example, depending on the system into which the invention is incorporated. If the maximum positive and negative voltages are selected, these values may be modified with certain safety tolerances factored in.

The analog-to-digital converter 70 may be any type conventionally known. For illustrative purposes, converter 70 is shown as including an operational amplifier 71 which buffers the output of the integrator to prevent an A/D converter from draining charge from the integrating capacitor. Typically, the A/D converter has a low impedance input and the integrator has a high impedance output. Once its buffering function is completed, the operational amplifier passes the output of the integrator to A/D converter 72, which may generate a 14-bit digital output at 10 MHz. The output of the A/D converter is then passed on to another system component, not shown.

The range extend bits latch may be a logic circuit whose function is to temporarily store digital information indicative of whether the overflow compensation circuit output a correction signal to the integrator. More specifically, when one of the negative or positive compensation circuits outputs a correction signal to the integrator, it simultaneously outputs a digital bit to the range extend bits latch. This information is used to modify the output of the A/D converter in order to provide an accurate digital representation of the input analog signal.

Even more specifically, when the overflow compensation circuit outputs a correction signal to the integrator, that signal causes the injection of a specific amount of charge to the lower plate of capacitor 4. This causes a corresponding voltage correction towards zero on the integrator output. The amount of this voltage correction is the same every time that the compensation circuit is triggered for one clock cycle. When the digital output value of the A/D converter is processed, a digital value corresponding to the corresponding voltage correction is added or subtracted to account for the injected charge.

In operation, the overflow compensation circuit and the analog-to-digital converter preferably operate at different clock phases preferably through the use of a two-phase clock. As shown in FIG. 3, A/D converter is operated in accordance with a first phase of a clock, and the D flip flops of the positive and negative compensation circuits are both operated based on a second phase of the clock. The first and second phases are selected so that they do not overlap. As a result, A/D conversion will take place only while correction is not in progress. This prevents the overflow compensation function from influencing the converted voltage value. If desired, the two-phase clock may be replaced by two separate clocks with non-overlapping clock periods.

Figure 4:
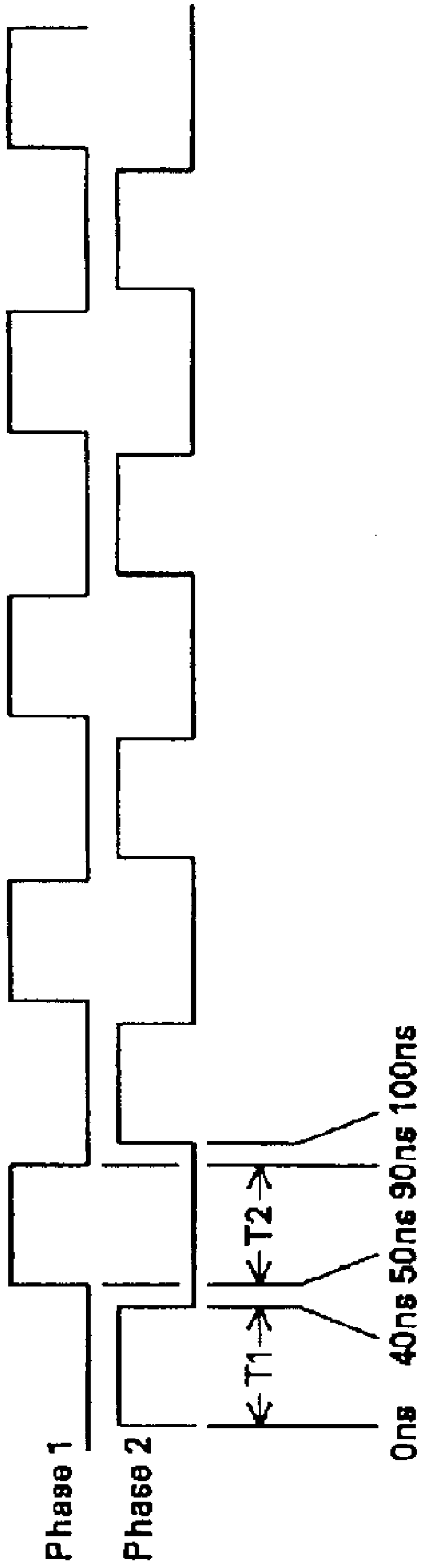
FIG. 4 is a timing diagram showing the two-phase clock signals used to control the operation of an overflow compensation circuit and an analog-to-digital converter circuit in accordance with preferred embodiments of the present invention.

To illustrate the manner of operation of an analog-to-digital converter circuit of the present invention, the following exemplary embodiment is provided with reference to FIGS. 3 and 4. In this circuit, CAP in the integrator is a 1.0 nanofarad capacitor, the positive and negative current sources are each 10.0 mA, and the reference voltages in the compensation circuits are ±1.0 volts, respectively. These voltages correspond to 50% of the operational limits of the analog-to-digital converter; i.e., if an input voltage greater than ±2.0 volts is provided to the converter, the converter may malfunction and/or become damaged.

When the output voltage of the integrator equals or exceeds +1.0 volt as detected by comparator CMP2, flip flop FF2 gets a 1 value latched into it for the duration of the Phase 2 clock period, which in this case is 40 ns. During this period, the negative current source of 10 mA is connected to the output of operational amplifier OP1 in the integrator, the result of which is to reduce the charge stored in the integrating capacitor CAP by 0.4 nanocoulombs resulting in a voltage decrease of 0.4 volts. Through this connection, a repeatable and measurable amount of charge is removed from the integrator to thereby ensure that the integrator output is lower than the upper operational limit of the A/D converter, i.e., to prevent an overflow condition into the converter.

In a similar manner, comparator CMP1 and flip flop FF1 are used to prevent a negative overflow condition into the A/D converter. That is, when the output voltage of the integrator is less than or equal to 1.0 volt as detected by comparator CMP1, flip flop FF1 gets a 1 value latched into it for the duration of the Phase 2 clock period, which is 40 ns. During this period, the positive current source is connected to the output of operational amplifier OP1 in the integrator, the result of which is to reduce the negative charge stored in the integrating capacitor CAP resulting in an increase of 0.4 volts on the capacitor CAP. Through this connection, a repeatable and measurable amount of charge is removed from the integrator to thereby ensure that the integrator output is higher than the lower operational limit of the A/D converter.

The process described above may be repeated as many times as necessary in order to infinitely convert an integrated input current without exceeding the positive or negative conversion limits of the A/D converter. An improved understanding of the overflow correction process of the invention may be further understood by the following explanation.

If the input current is set at −0.1 mA, then current is injected to capacitor CAP by OP1 circuit at a rate of plus 0.1 mA to balance the input current. This causes the voltage to rise on the output of operational amplifier OP1 at a rate of 0.1 mA/1.0 nF=$1\times10^5$ volts/second or 10 mV during every 100 ns clock cycle. After 100 clock cycles (e.g., 10 $\mu$sec), the output voltage on OP1 will become 1.0 volts. The next rising edge of the Phase 2 clock signal causes flip flop FF2 to be set to logic "true" for 40 ns, as shown by time T1 in FIG. 4. This causes 10 mA to be drained from capacitor CAP for 40 ns, thereby reducing the voltage stored therein by 400 mV.

As for the A/D converter, during time T2, the 1.0 volt output from OP1 is converted, but subsequent outputs of OP1 will be reduced by the 400 mV so as not to exceed the upper operational limit of the A/D converter. More specifically, during the next clock cycle, the voltage on capacitor CAP will be 1.0 V−0.4 V+0.01 V=0.61 volts. Correction of the integrator output in this manner may be further illustrated with reference to the following chart:

| Clock Cycle | A/D Reading | Range Extend Bits |
|---|---|---|
| 0 | 0.000 V | 0 0 |
| . | . | . |
| . | . | . |
| . | . | . |
| 98 | 0.980 V | 0 0 |
| 99 | 0.990 V | 0 0 |
| 100 | 1.000 V | 0 0 |
| 101 | 0.610 V | 0 1 |
| 102 | 0.620 V | 0 0 |

From the above chart, it is apparent that during clock cycle 99, the integrated charge is equal to the value read on cycle 99 minus the value read on cycle 98. Therefore, the reading at cycle 99 indicates that 0.01 V was integrated during the last 100 ns clock cycle. This corresponds to −0.1 mA (average) for 100 ns. On clock cycle 100, the calculation is the same.

On clock cycle 101, the difference is −0.39 V with a range extension bit indicating that the negative current source was injected for 40 ns at 10 mA into the 1.0 nF capacitor. This caused the removal of +0.40 V from the integrator output during cycle 101, resulting in the integration of a total of 0.01 V during the last 100 ns. This corresponds to −0.1 mA (average) for 100 ns.

By making these adjustments, it is apparent that the output of OP1 will never stay above 1.0 V, but will be reduced below that value on the clock cycle following the voltage exceeding 1.0 V. In a similar manner, if the input current is negative, then the positive current source will be used in certain intervals to prevent the output of OP1 from every going below −1.0 V for more than one clock cycle.

The third column in the above chart corresponds to the digital information set in the range extend bits latch shown in FIG. 3. The digital information in this latch provides an indication of whether the overflow compensation circuit sent a correction signal to the integrator during a previous clock cycle. If the negative compensation circuit sent a correction signal, flip flop FF2 will output a "1" bit to the range extend bits latch, causing the latch to store a logical value of "0 1." (See Block 140 in FIG. 2). If the positive compensation circuit sent a correction signal, flip flop FF1 will output a "1" to the range extend bits latch, causing the latch to store a logical value of "1 0." (See Block 150 in FIG. 2). The logical values in the latch are stored, for example, on the falling edge of the Phase 2 clock signal.

A analog-to-digital converter circuit according to preferred embodiments of the present invention also includes data gathering circuitry (not shown) which retrieves the digital output of the A/D converter every clock cycle, which in this case is every 100 ns. This circuitry also receives the digital information stored in the range extend bits latch to determine whether one of the positive or negative current sources were used to output a correction signal to the integrator during the last clock cycle. The data gathering circuitry then uses this information to compensate for the charge injected into the integrator to prevent overflow, by adjusting the accuracy of the A/D converter to reflect the voltage reduction that occurred in the capacitor. (See Block 160 in FIG. 2). A typical implementation of the data gathering circuitry may be a computer input port which reads in a 16-bit digital value once very 100 ns on the falling edge of the Phase 1 clock signal. This 16-bit value has 2 bits, which are the range extend bits and some or all of the remaining 14 bits are all of the output bits from the A/D converter. Those skilled in the art can appreciate that other type of data gathering circuits may also be used.

An alternative data gathering circuit could be an FPGA which is programmed to store the positive and negative correction values in digital registers. The FPGA is also programmed to add the proper correction value in to an extended accumulator register when an overflow correction has occurred. The digital sum of this overflow register and the A/D digital output value then represents the integrated output.

In the exemplary embodiment described above, the period of 40 ns was chosen to correspond to a time the negative or positive current sources are connected to the integrator for purposes of discharging the capacitor. This 40 ns duration allows the overflow compensation circuits of the present invention to correct the integrator output by about 0.40 volts under the operational limit of the A/D converter. Those skilled in the art can appreciate that this 40 ns duration is merely illustrative of the present invention, as other clock periods may be selected to effect different degrees of voltage discharge in the integrating capacitor in order to prevent an A/D converter overflow condition.

Figure 5:
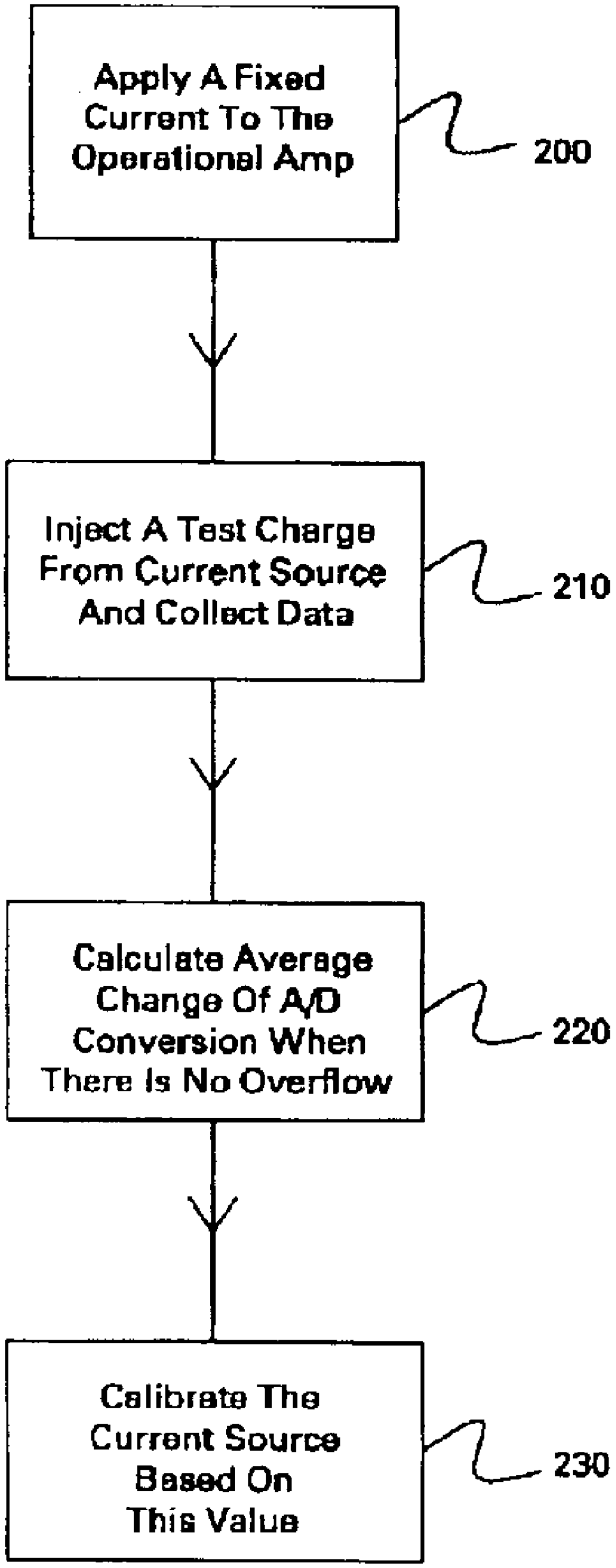
FIG. 5 is a flow diagram showing steps included in a method for calibrating a compensation circuit in accordance with preferred embodiments of the present invention.

In order to ensure proper operation, the amount of charge injected into the integrator by positive and negative current sources should be calibrated. Referring to FIG. 5, calibration may be performed by applying a small fixed current source to the input of operational amplifier OP1. (Block 200). The data gathering unit then gathers data over an extended period of time, which includes several injections of test charge by the current source being calibrated. (Block 210). A/D conversions of the output of the integrator are then performed based on the injected test charges. The average change of the A/D conversion value between adjacent clock cycles when no output overflow occurs is calculated. (Block 220). The change in A/D conversions when output overflow occurs must match this value. The value required to make this change equal is the amount of change attributed to the range extend bit. (Block 230). In the above exemplary embodiment discussed in greater detail below, the range bit voltage change value corresponds to 0.40 volts.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

What is claimed is:

1. A circuit for integrating electronic signals, comprising:

an integrator coupled to an electronic device; and a compensation circuit connected to said integrator, said compensation circuit comprising:

(a) a comparator which compares an output of the integrator to a reference value, and (b) a correction circuit which inputs a correction signal into the integrator if the comparator determines that the output of the integrator equals or exceeds the reference value, said correction signal reducing a subsequent output of the integrator to less than the reference value; wherein said reference value corresponds to an operational limit of said electronic device.

2. The circuit of claim 1, wherein said integrator comprises:

an operational amplifier; and a capacitor connected between an input and an output of the operational amplifier, wherein said correction signal comprises a charge which decreases voltage stored in said capacitor by a predetermined amount.

3. The circuit of claim 2, wherein said compensation circuit comprises:

a first compensation circuit comprising:

(a) a first comparator which compares an output of the integrator to a positive reference value, and (b) a first correction circuit which inputs a negative correction signal into the integrator if the first comparator determines that the output of the integrator equals or exceeds the positive reference value; and a second compensation circuit comprising:

(c) a second comparator which compares an output of the integrator to a negative reference value, and (d) a second correction circuit which inputs a positive correction signal into the integrator if the second comparator determines that the output of the integrator equals or exceeds the positive reference value.

4. The circuit of claim 3, wherein said negative correction signal derives from a positive current source, and said positive correction signal derives from a negative correction signal.

5. An analog-to-digital converter circuit, comprising:

an analog-to-digital converter;

an integrator connected to said analog-to-digital converter;

an overflow compensation circuit connected to said integrator, said overflow compensation circuit comprising:

(a) a comparator which compares an output of the integrator to a reference value, and (b) a correction circuit which inputs a correction signal into the integrator if the comparator determines that the output of the integrator equals or exceeds the reference value, said correction signal reducing a subsequent output of the integrator to less than the reference value, wherein said reference value corresponds to an operational limit of said analog-to-digital converter.

6. The analog-to-digital converter of claim 5, further comprising means for adjusting an output of the analog-to-digital converter based on an amount by which said subsequent output of the integrator has been decreased by said correction signal.

7. The analog-to-digital converter of claim 5, wherein said overflow compensation circuit operates in accordance with a first clock period and the analog-to-digital converter operates in accordance with a second clock period, and wherein said first clock period and said second clock period are non-overlapping clock periods where the first clock period occurs before the second clock period.

8. The analog-to-digital converter of claim 5, wherein said overflow compensation circuit comprises:

a first compensation circuit comprising:

(a) a first comparator which compares an output of the integrator to a positive reference value, and (b) a first correction circuit which inputs a negative correction signal into the integrator if the first comparator determines that the output of the integrator equals or exceeds the positive reference value; and a second compensation circuit comprising:

(c) a second comparator which compares an output of the integrator to a negative reference value, and (d) a second correction circuit which inputs a positive correction signal into the integrator if the second comparator determines that the output of the integrator equals or exceeds the positive reference value.

9. The analog-to-digital converter of claim 8, wherein said negative correction signal derives from a positive current source, and said positive correction signal derives from a negative current source.

10. A method for regulating an electronic integrator, comprising:

comparing an output of the integrator to a reference value; and if the output equals or exceeds the reference value, then inputting a correction signal into the integrator so that a subsequent output of the integrator is less than the reference value; and connecting the integrator to an analog-to-digital converter, said reference value being indicative of an operational limit of the analog-to-digital converter.

11. The method of claim 10, wherein said integrator comprises a capacitor connecting in parallel with an operational amplifier, and wherein said correction signal comprises a charge which decreases the voltage stored in said capacitor by a predetermined amount.

12. The method of claim 10, wherein said comparing and inputting steps are performed in accordance with a first clock period and the analog-to-digital converter operates in accordance with a second clock period, and wherein said first clock period and said second clock period are non-overlapping clock periods where the first clock period occurs before the second clock period.

13. The method of claim 12, wherein if the output equals or exceeds the reference value, then said method further comprises the step of adjusting an output of the analog-to-digital converter based on an amount by which a voltage of the integrator has been decreased by said correction signal.

14. A method for controlling an analog-to-digital converter, said analog-to-digital converter having an input connected to an integrator which includes a capacitor connected between an input and an output an operational amplifier, said method comprising the steps of:

comparing an output of the integrator to a reference value;

if the output equals or exceeds the reference value, then:

(a) injecting a fixed charge into the capacitor of the integrator to reduce the output of the integrator below the reference value, and (b) adjusting an output of the analog-to-digital converter based on said injected fixed charge.

15. The method of claim 14, wherein said reference value corresponds to an operational limit of the analog-to-digital converter.

16. The method of claim 15, wherein said comparing and injecting steps are performed in accordance with a first clock period and said analog-to-digital converter operates in accordance with a second clock period, and wherein the first clock period and the second clock period are non-overlapping clock periods where the first clock period occurs before the second clock period.

17. The method of claim 14, wherein step (a) comprises injecting said fixed charge from a current source, said method further comprising calibrating the current source by:

applying a fixed current to the integrator;

injecting a plurality of test charges from the current source into the integrator;

performing A/D conversions of the output of the integrator based on said plurality of test charges;

calculating a value corresponding to an average change in said A/D conversions when no overflow condition exists; and calibrating the current source to generate said fixed charge based on said value.

* * * * *